US008148740B2

(12) United States Patent
Kim et al.

(10) Patent No.: US 8,148,740 B2

(45) **Date of Patent: *Apr. 3, 2012**

(54) SEMICONDUCTOR LIGHT EMITTING DEVICE AND METHOD OF MANUFACTURING THE SAME

(75) Inventors: Tae Yun Kim, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/941,847

(22) Filed: Nov. 8, 2010

(65) Prior Publication Data

US 2011/0186812 A1 Aug. 4, 2011

Related U.S. Application Data

(63) Continuation of application No. 12/199,038, filed on Aug. 27, 2008, now Pat. No. 7,851,813.

(30) Foreign Application Priority Data

Aug. 29, 2007 (KR) ........................ 10-2007-0087275

(51) Int. Cl.
*H01L 33/00* (2010.01)

(52) U.S. Cl. .................... 257/89; 257/88; 257/E21.001; 257/E33.001

(58) Field of Classification Search .................... 257/89, 257/E21.001, E33.001
See application file for complete search history.

(56) References Cited

FOREIGN PATENT DOCUMENTS

JP 10242512 A 9/1998

*Primary Examiner* — Zandra Smith
*Assistant Examiner* — Marvin Payen
(74) *Attorney, Agent, or Firm* — Birch, Stewart, Kolasch & Birch, LLP

(57) ABSTRACT

Provided are a semiconductor light emitting device and a method of manufacturing the same. The semiconductor light emitting layer comprises a first conductive type semiconductor layer, an active layer on the first conductive type semiconductor layer, and a second conductive type semiconductor layer on the active layer. The active layer comprises a quantum well layer, a quantum barrier layer, and a dual barrier layer.

19 Claims, 4 Drawing Sheets

SEMICONDUCTOR LIGHT EMITTING DEVICE AND METHOD OF MANUFACTURING THE SAME

CROSS-REFERENCE TO RELATED APPLICATIONS

This application is a Continuation of application Ser. No. 12/199,038, filed Aug. 27, 2008, now U.S. Pat. No. 7,851, 813, and claims priority under 35 U.S.C. 119 to Korean Patent Application No. 10-2007-0087275 (filed on Aug. 29, 2007), which is hereby incorporated by reference in its entirety.

BACKGROUND

The present disclosure relates to a semiconductor light emitting device and a method of manufacturing the same.

Group III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

Embodiments provide a semiconductor light emitting device and a method of manufacturing the same, which make it possible to form a dual barrier layer in an active layer.

Embodiments provide a semiconductor light emitting device and a method of manufacturing the same, which make it possible to form a dual barrier layer comprising an intermediate well layer in an active layer.

Embodiments provide a semiconductor light emitting device and a method of manufacturing the same, which make it possible to improve the internal quantum efficiency by confinement of some electrons by forming a dual barrier layer in a bottom area and/or a center area of an active layer.

An embodiment provides a semiconductor light emitting device comprising: a first conductive type semiconductor layer; an active layer comprising a quantum well layer, a quantum barrier layer, and a dual barrier layer on the first conductive type semiconductor layer; and a second conductive type semiconductor layer on the active layer.

An embodiment provides a semiconductor light emitting device comprising: a first conductive type semiconductor layer; an active layer comprising a quantum well layer, a quantum barrier layer, and a dual barrier layer comprising an intermediate well layer, on the first conductive type semiconductor layer; and a second conductive type semiconductor layer on the active layer.

An embodiment provides a method of manufacturing a semiconductor light emitting device comprising: forming a first conductive type semiconductor layer; forming an active layer comprising a quantum well layer, a quantum barrier layer, and a dual barrier layer on the first conductive type semiconductor layer; and forming a second conductive type semiconductor layer on the active layer.

The details of one or, more embodiments are set forth in the accompanying drawings and the description below. Other features will be apparent from the description and drawings, and from the claims.

DETAILED DESCRIPTION OF THE EMBODIMENTS

Figure 1:
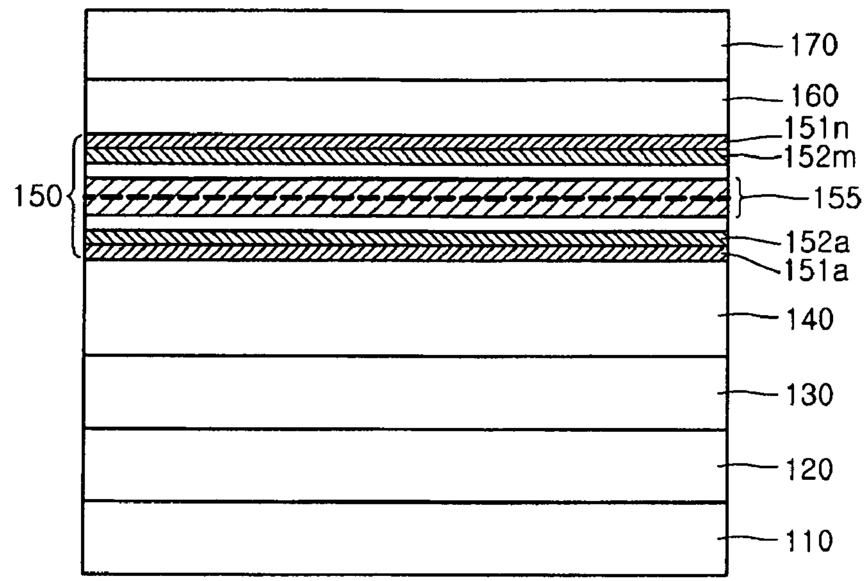
FIG. 1 is a sectional view of a semiconductor light emitting device according to a first embodiment.

Reference will now be made in detail to the embodiments of the present disclosure, examples of which are illustrated in the accompanying drawings.

In the description of embodiments, it will be understood that when a layer (or film) is referred to as being 'on/over' another layer or substrate, it can be directly on the other layer or substrate, or intervening layers may also be present. Also, it will be understood that when a layer is referred to as being 'on' or 'under' another layer, the reference about 'on' and 'under' each layer will be made on the basis of drawings. Also, the thickness of each layer in the drawings is an example, and is not limited thereto.

Figure 2:
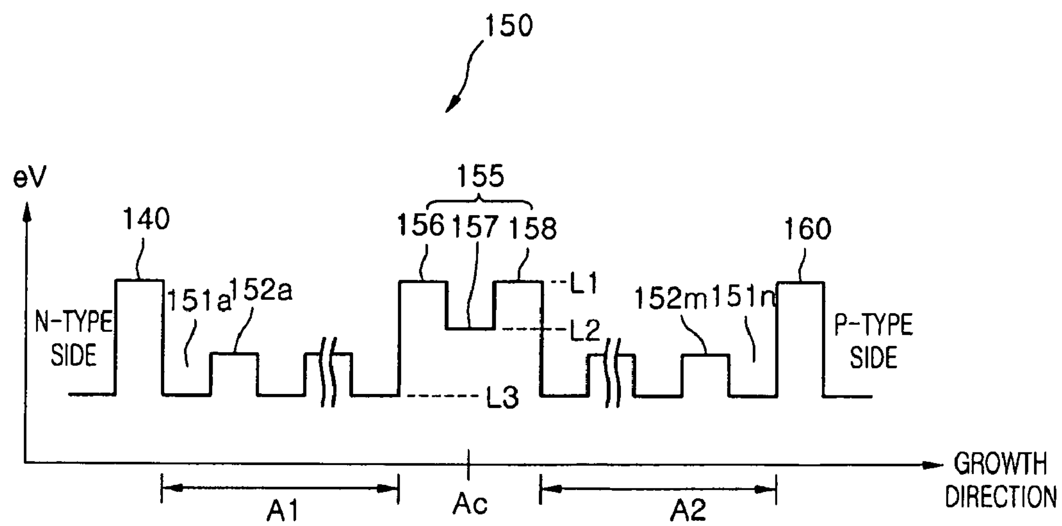
FIG. 2 is a diagram illustrating an energy band of an active layer according to the first embodiment.

FIG. 1 is a sectional view of a semiconductor light emitting device according to a first embodiment. FIG. 2 is a diagram illustrating an energy band of an active layer according to the first embodiment.

Referring to FIG. 1, a semiconductor light emitting device 100 comprises a substrate 110, a buffer layer 120, an undoped semiconductor layer 130, a first conductive type semiconductor layer 140, an active layer 150, a second conductive type cladding layer 160, and a second conductive type semiconductor layer 170.

The substrate 110 may be formed using at least one of sapphire ($Al_2O_3$), SiC, Si, GaAs, GaN, ZnO, Si, GaP, InP, and Ge, and may be a conductive substrate. A concavo-convex pattern may be formed on and/or under the substrate 110, and the shape of the concavo-convex pattern may comprise any one of a stripe shape, a lens shape, a pillar shape, and a horn shape.

A nitride semiconductor may be grown on the substrate 110 by electron beam deposition, physical vapor deposition (PVD), chemical vapor deposition (CVD), plasma laser deposition (PLD), a dual-type thermal evaporator, sputtering, or metal organic chemical vapor deposition (MOCVD), to which the present invention is not limited.

The buffer layer 120 may be formed on the substrate 110. The buffer layer 120 reduces a lattice mismatch with the substrate 110, and may be formed of at least one of GaN, InN, AlN, InGaN, AlGaN, InAlGaN, and AlInN.

The undoped semiconductor layer 130 is formed on the buffer layer 120. The undoped semiconductor layer 130 may be formed of an undoped GaN layer. The undoped GaN layer is used as a substrate where a nitride semiconductor is grown. Only one or both of the buffer layer 120 and the undoped semiconductor layer 130 may be formed, or both of them may be removed.

The first conductive type semiconductor layer 140 is formed on the undoped semiconductor layer 130. The first conductive type semiconductor layer 140 is formed of at least one layer of n-type semiconductor layer and is doped with the first conductive type dopant. The first conductive type semiconductor layer 140 may serve as a first electrode contact layer, and may be formed of at least one of GaN, InN, AlN, InGaN, AlGaN, InAlGaN, and AlInN. The first conductive type semiconductor layer 140 is doped with a first conductive type dopant. The first conductive type dopant comprises Si, Ge, Sn, Se, and Te.

A first conductive type cladding layer (not shown) may be formed on the first conductive type semiconductor layer 140. The first conductive type cladding layer may be embodied in a single-layer or multi-layer n-type semiconductor layer, and may comprise an n-type AlGaN layer or an n-type AlInGaN layer.

The active layer 150 may be formed on the first conductive type semiconductor layer 140, and the second conductive type cladding layer 160 may be formed on the active layer 150. The second conductive type semiconductor layer 170 is formed on the second conductive type cladding layer 160.

The active layer 150 may be formed in a multiple quantum well structure, and comprises quantum well layers 151*a* and 151*n*, quantum barrier layers 152*a* and 152*m*, and a dual barrier layer 155. The quantum well layers 151*a* and 151*n* may be formed in 2 to 10 periods with a period of the dual barrier layer 155 or the quantum barrier layers 152*a* and 152*m*.

The quantum well layers 151*a* and 151*n* may be formed of InGaN, and the quantum barrier layers 152*a* and 152*m* may be formed of one of AlGaN, InGaN, AlInGaN, and GaN. The materials of the quantum well layers 151*a* and 151*n* and the quantum barrier layers 152*a* and 152*m* may vary depending on the light emitting wavelengths. For example, the periods of the quantum well layers/the quantum barrier layers may be embodied in AlGaN/GaN, InGaN/GaN, InGaN/InGaN, AlGaAs/GaAs, InGaAs/GaAs, InGaP/GaP, AlInGaP/InGaP, or InP/GaAs. Also, the light emitting wavelength of the active layer 150 may vary depending on the composition ratio of In or Al, to which the present invention is not limited. Hereinafter, for the convenience of description, it is assumed that the quantum well layers 151*a* and 151*n* are InGaN layers and the quantum barrier layers 152*a* and 152*m* are AlGaN layers.

Also, the number of the quantum barrier layers 152*a* and 152*m* may be equal to or different from the number of the quantum well layers 151*a* and 151*n*. Also, the quantum well layer 151*a* may be formed on the first conductive type semiconductor layer 140 and the quantum well layer 151*n* may be formed under the second conductive type cladding layer 160, to which the present invention is not limited.

Each of the quantum well layers 151*a* and 151*n* may be formed to a thickness of 15 to 30 Å, and each of the quantum barrier layers 152*a* and 152*m* may be formed to a thickness of 50 to 300 Å.

The dual barrier layer 155 comprises dual-structure barrier layers and a well structure between the dual-structure barrier layers. The dual barrier layer 155 is formed in one period with the specific quantum well layer, and may be formed in singularity or plurality. The dual barrier layer 155 may be formed to a thickness of 150 to 250 Å.

The dual barrier layer 155 confines some of electrons injected in the active layer 150 to the bottom of the dual barrier layer 155, thereby making it possible to increase the possibility of the electron-hole recombination in the bottom of the active layer 150. The dual barrier layer 155 will be described below in detail.

The second conductive type cladding layer 160 may be embodied in a single-layer or multi-layer n-type semiconductor layer on the active layer 150, and the n-type semiconductor layer may comprise an AlGaN layer or an AlInGaN layer. Also, the second conductive type cladding layer 160 may not be formed.

The second conductive type semiconductor layer 170 is formed on the second conductive type cladding layer 160. The second conductive type semiconductor layer 170 is formed of at least one layer of p-type semiconductor layer and is doped with p-type dopant. The second conductive type semiconductor layer 170 may be used as an electrode contact layer. The p-type semiconductor layer may be formed of one of compound semiconductors such as GaN, InN, AlN, InGaN, AlGaN, InAlGaN, and AlInN. The p-type dopant may comprise at least one of Mg, Zn, Ca, Sr, and Ba.

A transparent electrode layer (not shown) may be formed on the second conductive type semiconductor layer 170. The transparent electrode layer may be formed of one of ITO, ZnO, IrOx, RuOx, and NiO. The semiconductor light emitting device 100 may be embodied in such a way that the first conductive type semiconductor layer 140 is an n-type semiconductor layer and the second conductive type semiconductor layer 170 is a p-type semiconductor layer, and the reverse is also possible. Also, an n-type semiconductor layer or a p-type semiconductor layer may be formed on the second conductive type semiconductor layer 170. Accordingly, the semiconductor light emitting device 100 may be embodied in one of an n-p junction structure, a p-n junction structure, an n-p-n junction structure, and a p-n-p junction structure.

Referring to FIGS. 1 and 2, the active layer 150 may be divided into a lower active layer A1, a dual barrier layer 155, and an upper active layer A2.

The lower active layer A1 is disposed between the dual barrier layer 155 and the first conductive type semiconductor layer 140, and the upper active layer A2 is disposed between the dual barrier layer 155 and the second conductive type cladding layer 160. For example, if the active layer 150 is formed in 10 periods, the lower active layer A1 may be formed in 4 to 5 periods and the upper active layer A2 may be formed in 5 to 6 periods. The period of the lower active layer A1 may be equal to or more than the period of the upper active layer A2.

For example, the active layer 150 may comprise quantum well layers 151*a* and 151*n* formed of InGaN and quantum barrier layers 152*a* and 152*m* formed of AlGaN, by selectively supplying sources of $NH_3$, TMGa (or TEGa), TMIn, and TMAl using carrier gas of $H_2$ and/or $N_2$ under a predetermined growth temperature (e.g., 700 to 1000° C.).

The dual barrier layer 155 of the active layer 150 comprises a first barrier layer 156, an intermediate well layer 157, and a second barrier layer 158. The first barrier layer 156 and the second barrier layer 158 are formed between quantum well layers (not shown), and the intermediate well layer 157 is formed between the first barrier layer 156 and the second barrier layer 158.

The first barrier layer 156 and the second barrier layer 158 are formed in a composition equation of $Al_xGa_{1-x}N$ and the intermediate well layer 157 is formed in a composition equation of $In_yGa_{1-y}N$, where $0<x\leqq 0.5$ and $0\leqq y\leqq 1$.

The first barrier layer 156 and the second barrier layer 158 may be formed to be asymmetrical or symmetrical while having the same thickness. The dual barrier layer 155 may has a greater thickness than other quantum barrier layers, or may be formed to a thickness of 150 to 250 Å.

The first and second barrier layers 156 and 158 may be grown at a temperature higher by about 40 to 100° C. than the growth temperature (e.g., 700 to 900° C.) of the quantum well layers 151*a* and 151*n*.

The growth temperature of the intermediate well layer 157 of the dual barrier layer 155 may be within the range of the growth temperature (700 to 900° C.) of the quantum well layer. The growth temperature of the intermediate well layer 157 of the dual barrier layer 155 may be lower than the growth temperature of the first and second barrier layers 156 and 158.

Also, an In composition ratio in the intermediate well layer 157 of the dual barrier layer 155 may vary depending on the growth thickness. For example, the intermediate well layer 157 may be formed at the same In composition ratio as the InGaN quantum well layers 151*a* and 151*n*, or may be formed at a higher In composition ratio than the quantum well layers 151*a* and 151*n*.

An energy band L2 of the intermediate well layer 157 of the dual barrier layer 155 may be higher than an energy band L3 of the quantum well layers 151*a* and 151*n* and lower than an energy band L1 of the first and second barrier layers 156 and 158. Also, the energy band L1 of the first and second barrier layers 156 and 158 may be higher than an energy band of the quantum barrier layers 152*a* and 152*m*.

The dual barrier layer 155 may be formed at a center Ac of the active layer 150, or may be formed nearer to the first conductive type semiconductor layer 140 than to the second conductive type cladding layer 160. That is, the dual barrier layer 155 may be formed nearer to an n-type semiconductor layer than to a p-type semiconductor layer.

As described above, the dual barrier layer 155 is formed in the active layer 150, thereby confining some electrons in the lower active layer A1. Accordingly, the distribution of electrons and holes in the active layer 150 is improved, thus making it possible to increase the probability of the electron-hole recombination in the active layer 150. In particular, the probability of the electron-hole recombination in the lower active layer A1 of the active layer 150 can be increased. The dual barrier layer 155 is disposed adjacent to the center Ac of the active layer 150 or near to the n-type semiconductor layer, thereby making it possible to induce the electron-hole recombination by the intentional confinement of some electrons.

Also, the electrons are confined in the active layer 150, thereby making it possible to increase the internal quantum efficiency, to suppress the generation of a leakage current of excess electrons, and to suppress the generation of an over-current in a high-temperature operation. Also, it is possible to reduce a strain in the active layer 150.

The degradation of the light emitting efficiency of the semiconductor light emitting device 100 can be prevented and the electrical performance can be improved.

Figure 3:
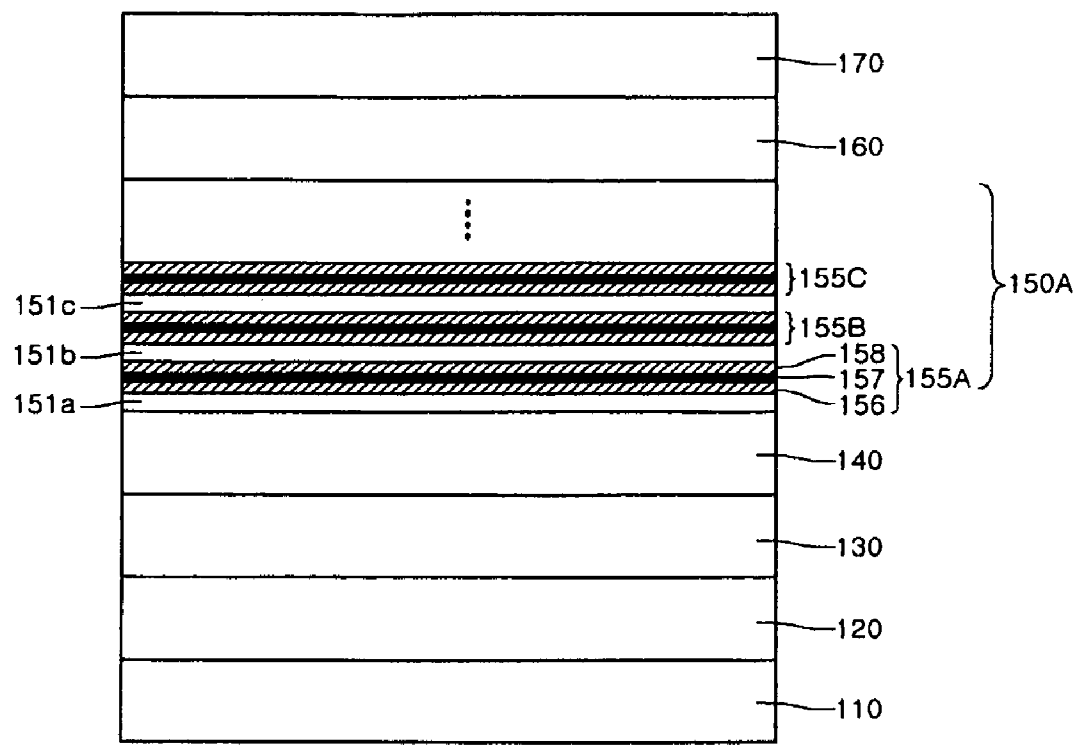
FIG. 3 is a sectional view of a semiconductor light emitting device according to a second embodiment.

FIG. 3 is a sectional view of a semiconductor light emitting device according to a second embodiment. Like reference numerals refer to like elements in the first and the second embodiments, and the same descriptions thereof will be omitted.

Referring to FIG. 3, a semiconductor light emitting device 100A comprises the active layer 150A formed a quantum well layers 151*a*, 151*b* and 151*c*, a quantum barrier layers (not shown), a plurality of dual barrier layers 155A, 155B and 155C.

The active layer 150A comprises a multiple quantum well structure. The dual barrier layers 155A, 155B and 155C in the active layer 150A can be formed with the fixed interval. The dual barrier layers 155A, 155B and 155C are disposed between a center area of the active layer 150A and the first conductive type semiconductor 140.

Each of the dual barrier layers 155A, 155B and 155C can be formed in one period with the quantum well layer 151*a*, 151*b* and 151*c*. At least one of the quantum well layers and the quantum barrier layers can be disposed between the dual barrier layers 155A, 155B and 155C.

Each of the dual barrier layers 155A, 155B and 155C of the active layer 150A comprises a first barrier layer 156, an intermediate well layer 157, and a second barrier layer 158. The first barrier layer 156 and the second barrier layer 158 are formed between quantum well layers (not shown), and the intermediate well layer 157 is formed between the first barrier layer 156 and the second barrier layer 158.

The first barrier layer 156 and the second barrier layer 158 are formed in a composition equation of $Al_xGa_{1-x}N$ and the intermediate well layer 157 is formed in a composition equation of $In_yGa_{1-y}N$, where $0<x\leqq 0.5$ and $0\leqq y\leqq 1$.

As described above, the dual barrier layers 155A, 155B and 155C are formed in the active layer 150A, thereby confining some electrons in the lower active layer. Accordingly, the distribution of electrons and holes in the active layer 150A is improved, thus making it possible to increase the probability of the electron-hole recombination in the active layer 150A. In particular, the probability of the electron-hole recombination in the lower area of the active layer 150A can be increased. The dual barrier layers 155A, 155B and 155C are disposed adjacent to the center area of the active layer 150A or near to the n-type semiconductor layer, thereby making it possible to induce the electron-hole recombination by the intentional confinement of some electrons.

Also, the electrons are confined in the active layer 150A, thereby making it possible to increase the internal quantum efficiency, to suppress the generation of a leakage current of excess electrons, and to suppress the generation of an over current in a high-temperature operation. Also, it is possible to reduce a strain in the active layer 150A.

The degradation of the light emitting efficiency of the semiconductor light emitting device 100A can be prevented and the electrical performance can be improved.

Figure 4:
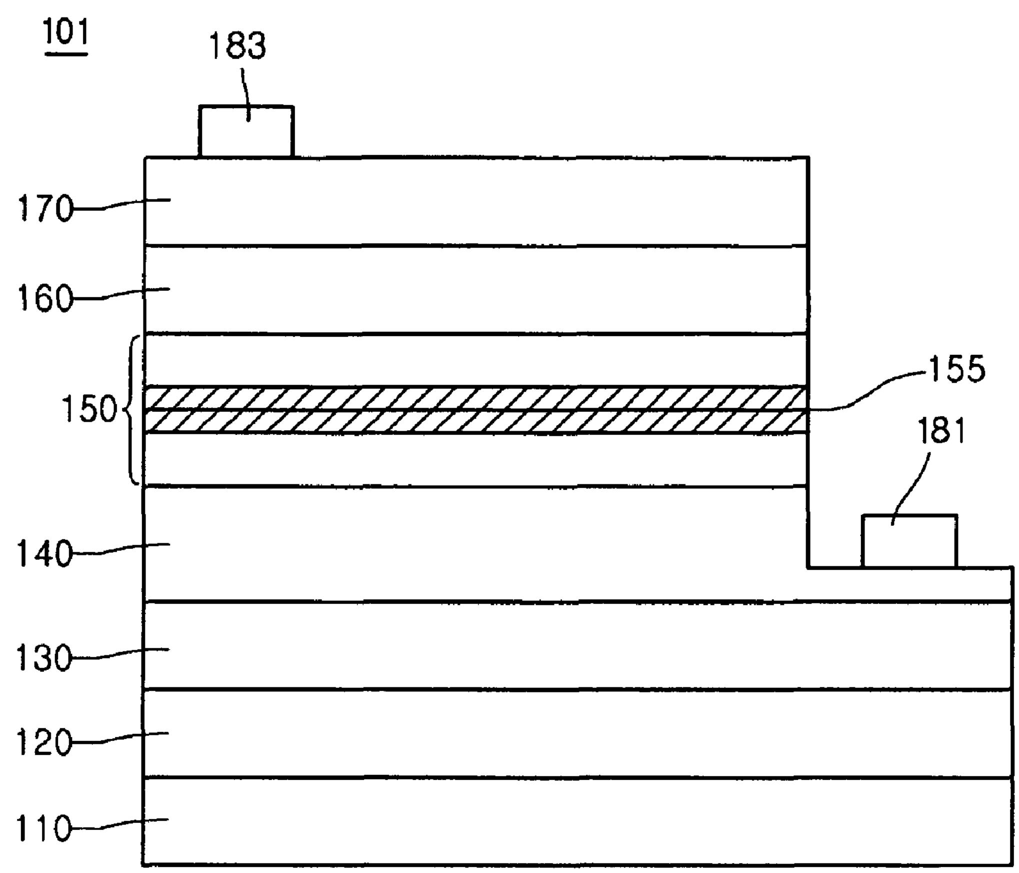
FIG. 4 is a sectional view of a horizontal semiconductor light emitting device based on FIG. 1.

FIG. 4 is a sectional view of a horizontal semiconductor light emitting device based on FIG. 1.

Referring to FIG. 4, a horizontal semiconductor light emitting device 101 comprises a first electrode 181 formed on a first conductive type semiconductor layer 140, and second electrode 183 formed on a second conductive type semiconductor layer 170.

Figure 5:
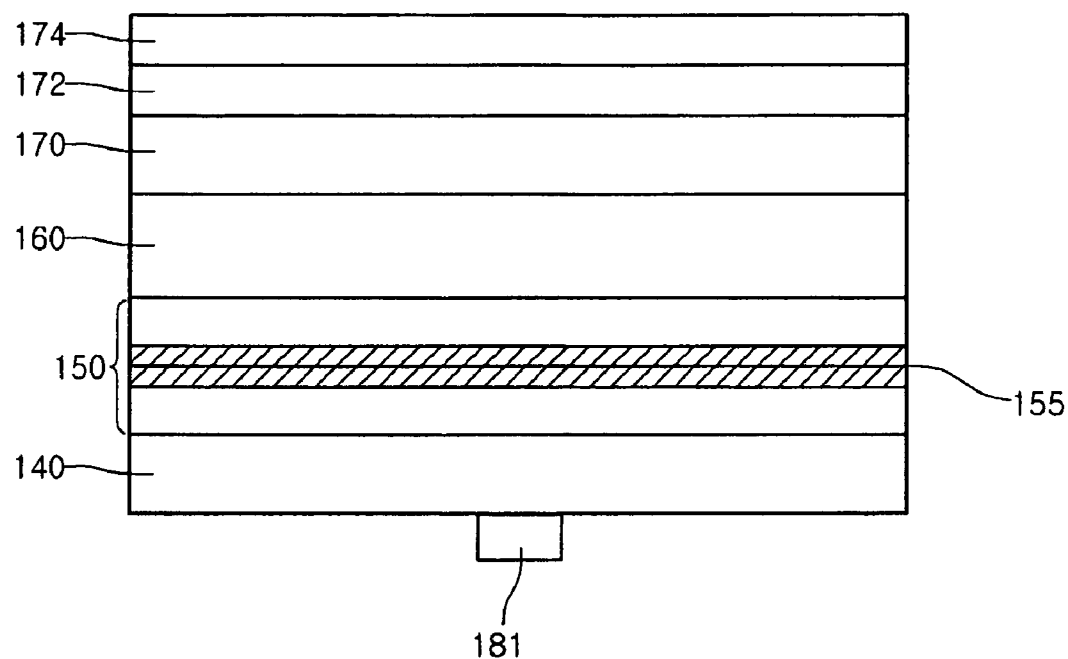
FIG. 5 is a sectional view of a vertical semiconductor light emitting device based on FIG. 1.

FIG. 5 is a sectional view of a vertical semiconductor light emitting device based on FIG. 1.

Referring to FIG. 5, a vertical semiconductor light emitting device 102 comprises a reflection electrode layer 172 formed on the second conductive type semiconductor layer 170 of FIG. 1, and a conductive support substrate 174 formed on the reflection electrode layer 172. The reflection electrode layer 172 may be formed in a single layer or in multiple layers using at least one of Al, Ag, Pd, Rh, and Pt, and the conductive support substrate 174 may be formed using copper or gold, to which the present invention is not limited.

Then, the substrate 110 of FIG. 1 is removed physically and/or chemically. Herein, the physical removing process may remove the substrate 110 by an LLO process that irradiates a laser of a predetermined wavelength onto the substrate 110, and the chemical removing process may separate the substrate 110 by injecting etchant into the buffer layer 120 of FIG. 1.

Then, a first electrode 181 may be formed under the first conductive type semiconductor layer 140.

As shown in FIGS. 4 and 5, a dual barrier layer 155 is formed adjacent to a center of the active layer 150 in the semiconductor light emitting layers 101 and 102, thereby confining some electrons in the bottom of the active layer. Accordingly, the distribution of electrons and holes in the active layer 150 is improved, thus making it possible to increase the probability of the electron-hole recombination. In particular, the probability of the electron-hole recombination in the bottom of the active layer 150 can be increased. The dual barrier layer 155 is disposed adjacent to the center of the active layer 150 or near to the n-type semiconductor layer, thereby making it possible to induce the electron-hole recombination by the intentional confinement of electrons.

Also, the electrons are confined in the active layer 150, thereby making it possible to increase the internal quantum efficiency, to suppress the generation of a leakage current of excess electrons, and to suppress the generation of an overcurrent in a high-temperature operation. Also, it is possible to reduce a strain in the active layer 150.

The degradation of the light emitting efficiency of the semiconductor light emitting device 100 can be prevented and the electrical performance can be improved.

Although the embodiments have illustrated a compound semiconductor light emitting device of an N-P junction structure, the present invention may also be embodied in a compound semiconductor light emitting device of a p-n, n-p-n, or p-n-p junction structure. The embodiments are not limited to the above-described structure, and various layers may be further formed between the respective layers depending on the characteristics of the light emitting device.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:

a first conductive type semiconductor layer;

a second conductive type semiconductor layer; and an active layer between the first conductive type semiconductor layer and the second conductive type semiconductor layer, wherein the active layer comprises a first active layer, a second active layer, and a first dual barrier layer between the first active layer and the second active layer, wherein the first active layer includes at least one period of a first well layer and a first barrier layer, wherein the second active layer includes at least one period of a second well layer and a second barrier layer, and wherein the first dual barrier layer has a thickness greater than a thickness of the first barrier layer and/or the second barrier layer, wherein the first dual barrier layer includes a third barrier layer and a fourth barrier layer between the first active layer and the second active layer.

2. The light emitting device according to claim 1, wherein the first dual barrier layer includes an intermediate well layer between the third barrier layer and the fourth barrier layer.

3. The light emitting device according to claim 1, wherein the first active layer and the second active layer comprise a multiple quantum well structure.

4. The light emitting device according to claim 1, further comprising:

a second dual barrier layer in the first active layer and/or the second active layer.

5. The light emitting device according to claim 1, wherein the first dual barrier layer is configured to confine some of electrons injected in the active layer.

6. The light emitting device according to claim 2, wherein the third barrier layer is formed of $Al_xGa_{1-x}N$ ($0 \leqq x \leqq 0.5$) under the intermediate well layer, and the fourth barrier layer is formed of $Al_xGa_{1-x}N$ ($0 \leqq x \leqq 0.5$) on the intermediate well layer.

7. The light emitting device according to claim 2, wherein the intermediate well layer is formed of $In_yGa_{1-y}N$ ($0 \leqq y \leqq 1$).

8. The light emitting device according to claim 2, wherein the intermediate well layer comprises an In composition ratio greater than an In composition ratio of the first well layer and/or the second well layer.

9. The light emitting device according to claim 1, wherein the first dual barrier layer has a thickness of 150 to 250 Å.

10. The light emitting device according to claim 2, wherein the third barrier layer and the fourth barrier layer of the first dual barrier layer are formed with a same thickness or a different thickness.

11. The light emitting device according to claim 2, wherein the intermediate well layer of the first dual barrier layer has an energy band higher than an energy band of the first well layer and/or the second well layer.

12. A light emitting device, comprising:

a conductive support substrate;

a light emitting structure including a first conductive type semiconductor layer, a second conductive type semiconductor layer, and an active layer between the first conductive type semiconductor layer and the second conductive type semiconductor layer; and a first electrode on the light emitting structure, wherein the active layer comprises a first active layer, a second active layer, and a dual barrier layer between the first active layer and the second active layer, wherein the dual barrier layer includes a first sub barrier layer and a second sub barrier layer between the first active layer and the second active layer, and wherein the dual barrier layer is overlapped with the conductive support substrate and the first electrode.

13. The light emitting device according to claim 12, wherein the dual barrier layer comprises an intermediate well layer between the first sub barrier layer and the second sub barrier layer, and wherein the first sub barrier layer is formed of $Al_xGa_{1-x}N$ ($0 \leqq x \leqq 0.5$) under the intermediate well layer and the second sub barrier layer is formed of $Al_xGa_{1-x}N$ ($0 \leqq x \leqq 0.5$), on the intermediate well layer.

14. The light emitting device according to claim 12, wherein the dual barrier layer comprises an intermediate well layer which is formed of GaN or InGaN, and the intermediate well layer has an energy band lower than an energy band of the first sub barrier layer and/or the second sub barrier layer.

15. The light emitting device according to claim 12, wherein the dual barrier is at least one in number and is disposed between a center of the active layer and the first conductive type semiconductor layer.

16. The light emitting device according to claim 12, further comprising:

a conductive cladding layer on and/or under the active layer.

17. The light emitting device according to claim 12, wherein the active layer is formed in 2 to 10 periods.

18. The light emitting device according to claim 12, wherein an energy band of the first sub barrier layer and the second sub barrier layer is higher than an energy band of the first barrier layer.

19. The light emitting device according to claim 12, wherein the dual barrier layer is formed nearer to the first conductive type semiconductor layer than to the second conductive type semiconductor layer.

* * * * *